US006545928B1

United States Patent
Bell (10) Patent No.: US 6,545,928 B1
(45) Date of Patent: Apr. 8, 2003

(54) ANTIFUSE PROGRAMMING CURRENT LIMITER

(75) Inventor: Debra M. Bell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/964,110

(22) Filed: Sep. 25, 2001

(51) Int. Cl.⁷ .......................................... G11C 11/4063
(52) U.S. Cl. ...................... 365/225.7; 365/96; 365/200
(58) Field of Search ............................. 365/225.7, 200, 365/96

(56) References Cited

U.S. PATENT DOCUMENTS 5,418,738 A * 5/1995 Abadeer et al. ............... 257/50
5,668,751 A    9/1997 Sher et al. ..................... 365/96
5,680,360 A * 10/1997 Pilling et al. ........... 365/189.02
6,016,264 A *  1/2000 Lin ............................ 365/225.7
6,128,241 A * 10/2000 Choi ............................ 365/200

* cited by examiner

Primary Examiner—David Nelms
Assistant Examiner—Tu-Tu Ho
(74) Attorney, Agent, or Firm—Dorsey & Whitney LLP (57) ABSTRACT

Methods for enhancing the programming of antifuses are discussed. The methods include accessing an antifuse in an antifuse bank by providing an address, raising a signal source to a high voltage level for programming the antifuse, sensing current flowing through the antifuse, and inhibiting current from flowing through the antifuse without having to delay by a programmed time period when the current is sensed by the act of sensing. The act of inhibiting continues to inhibit current from flowing until another address is provided. The methods also include accessing antifuses in multiple banks and programming them simultaneously.

40 Claims, 6 Drawing Sheets

ANTIFUSE PROGRAMMING CURRENT LIMITER

TECHNICAL FIELD

This invention relates generally to semiconductor integrated circuits. More particularly, it pertains to enhancing the process of programming antifuse circuitry so that less time is required to manufacture an integrated circuit, such as a memory device.

BACKGROUND OF THE INVENTION

Semiconductor manufacturers generally incorporate antifuse circuitry into an integrated circuit, such as a memory device. The antifuse circuitry, like read-only memory, can be programmed to uniquely identify the memory device or provide other information about the memory device. Identifying information may include a serial number, various types of circuit components that are on the memory device, and the manufacturing date and time. If the memory device is returned to the manufacturer for various reasons, the manufacturer can extract these pieces of information to improve its manufacturing processes. Another use for the antifuse circuitry is for repairing a memory device that has defective memory cells. The antifuse circuitry can be programmed to remap addresses of these defective memory cells to functional memory cells of the memory device. In this way, the antifuse circuitry helps to salvage defective memory devices.

Antifuses are fabricated with a structure similar to that of a capacitor in which two conductive terminals are separated by a dielectric layer. In the unprogrammed state in which the antifuse is manufactured, a high resistance exists between the two conductive terminals. To transition the unprogrammed state of the antifuse to a programmed state, a large programming voltage is applied across the two conductive terminals of the antifuse to break down the interposed dielectric layer. When the dielectric layer is broken down, a short is created to electrically link the two conductive terminals of the antifuse so that current can flow between the two conductive terminals.

Figure 1:
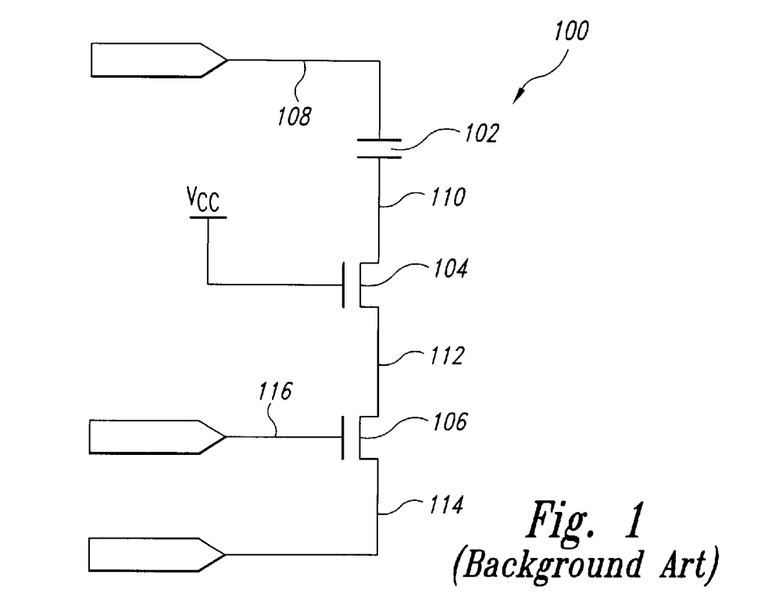
FIG. 1 is a circuit diagram of a conventional antifuse circuit.

This programming current, in certain circumstances, may be too large and can create a problem in the programming of other antifuses. FIG. 1 is a circuit diagram of a conventional antifuse circuitry 100 in which this problem is further explained. An antifuse 102 has a first terminal coupled to a node 108 and a second terminal coupled to a node 110. Also coupled to the node 110 is a source of an n-channel transistor 104; its gate is coupled to a source of positively pumped voltage, and its drain is coupled to a node 112. A source of another nchannel transistor 106 is coupled to the node 112; the gate of this transistor is coupled to a node 116, and its drain is coupled to a node 114.

When an antifuse 102 is to be programmed, three signals are provided to the antifuse circuitry 100. A signal CGND at a high voltage level, such as about 10 volts, is provided at the node 108. Another signal to turn ON the n-channel transistor 106 is a signal DQ* (or the complement of a signal DQ) provided at the node 116 at a high voltage level. A third signal, which is at ground, is an ADDRESS or FA (FUSE ADDRESS) signal, and it is provided at the node 114. When these three signals are provided to the antifuse circuitry 100, the antifuse 102 changes its highly resistive state to a short, and thereby, this change in state denotes a desired bit of information.

More specifically, the large programming voltage of the CGND signal breaks down the dielectric layer of the antifuse 102, and hence, creates a short between the two conductive terminals of the antifuse 102. Both the n-channel transistors 104 and 106 are turned ON because their gates are coupled to the high voltage signals. Therefore, a conductive path is set up for a programming current to flow through the antifuse 102 to reach ground at the source of the ADDRESS signal. However, if this programming current is too large, it may depress the programming voltage of the CGND so that other antifuses may be prevented from being programmed at the same time as the antifuse 102. To fix this, one may shut down the programming process, change the address to point to the next antifuse to be programmed, and turn ON the programming process again. The problem with this approach is that it lengthens the programming time of antifuses, which delays the manufacturing process and results in costlier products.

One technique to solve this problem so that the overall programming time is minimized is discussed by Sher et al. in U.S. Pat. No. 5,668,751. Sher et al. describe a circuit 101 shown in FIG. 2 that includes an antifuse 103 having a first terminal coupled to a node 113 from which a programming voltage signal is provided and a second terminal coupled to a node 117. Also coupled to the node 117 is a first terminal of a switch 105. A second terminal of the switch 105 is coupled to a node 119. A current monitor 107 to monitor current flowing through the antifuse 103 is coupled to the node 119 at one of its three terminals; its second terminal is coupled to ground 115 and its third terminal is coupled to a comparison circuit 109 via a node 121. The result of the comparison is sent to a delay circuit 111 by the comparison circuit 109 via a node 123. The delay circuit 111 controls the state of the switch 105 by sending over the node 125 a control signal to turn the switch 105 ON or OFF.

Figure 2:
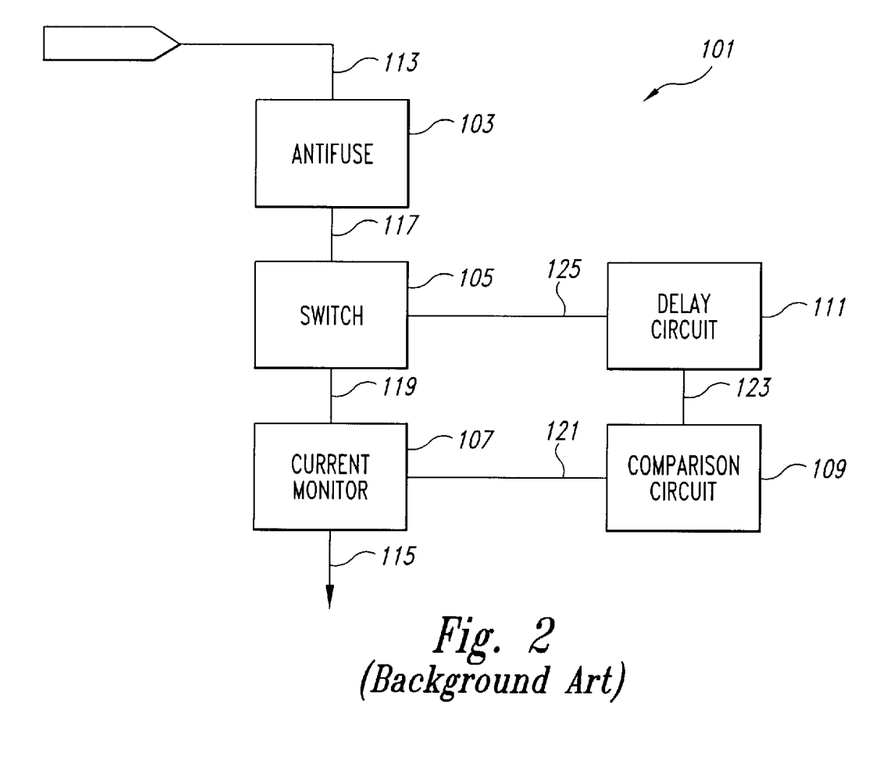
FIG. 2 is a block diagram of another conventional antifuse circuit.

When the antifuse 103 is to be programmed, the switch 105 is ON and a high voltage signal is provided at the node 113 to break down the high-resistance dielectric of the antifuse 103. More current will flow as the dielectric becomes less resistive. This current is monitored by the current monitor 107, and the monitored current is communicated to the comparison circuit 109 via the node 121. When the monitored current reaches a trigger level, the comparison circuit 109 allows the delay circuit 111 to initiate a delay period, which is preprogrammed to reflect the time required to break down the dielectric to obtain a desired level of conductance. At the end of this delay period, the delay circuit 111 turns OFF the switch 105 to thereby interrupt the current through the antifuse 103.

Thus, the circuit 101 of Sher et al. minimizes the programming time by focusing on limiting the time spent to program each antifuse through the use of a customized delay period. However, unlike the present invention, Sher et al. do not seem to recognize the need to program multiple fuses contemporaneously. To program multiple fuses using the circuit 101 of Sher et al. would require duplicating a number of components discussed above. This may increase both cost and complexity in manufacturing. Thus, there is a need for devices and methods to limit the current during programming of an antifuse so that other antifuses may be programmed at the same time without increasing cost and complexity.

SUMMARY OF THE INVENTION

An illustrative aspect of the present invention includes a circuit and a method for limiting current drawn by an antifuse during programming. A voltage, generated from current that indicates whether the antifuse is programmed, is detected. This detected voltage enables an inhibitor to create an open circuit between a programming voltage supply and ground to inhibit the antifuse from thereafter drawing a large amount of current. The act of inhibiting is contemporaneously executed without waiting for a predetermined period of time to elapse by a delaying circuit.

DETAILED DESCRIPTION OF THE INVENTION

In the following detailed description of various embodiments of the invention, reference is made to the accompanying drawings, which form a part hereof, and in which are shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, electrical, and other changes may be made without departing from the spirit or scope of the present invention. The following detailed description is, therefore, not to be taken in a limiting sense.

Figure 3:
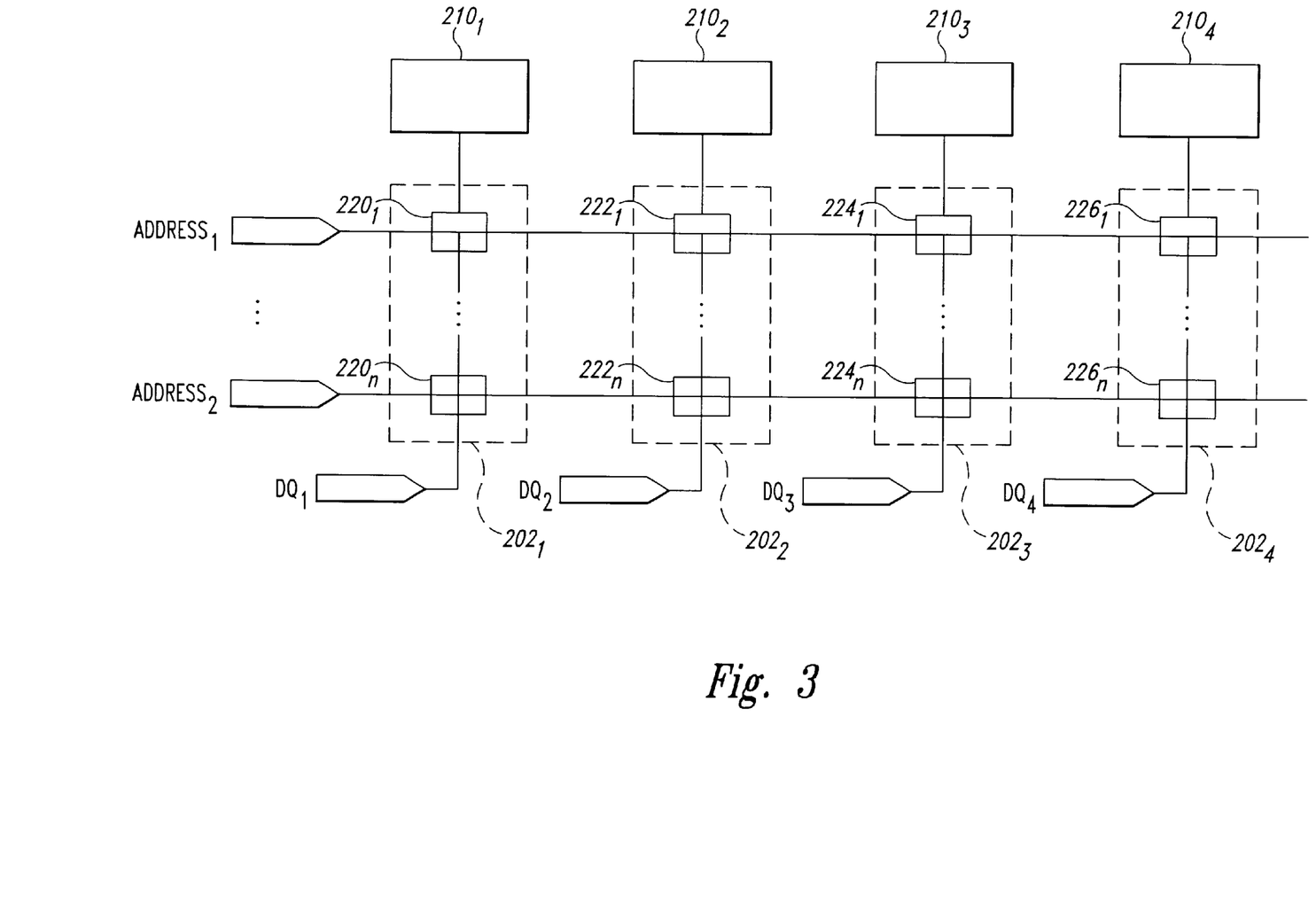
FIG. 3 is a block diagram of several antifuse banks according to one embodiment of the present invention.

FIG. 3 is a block diagram of several antifuse banks $202_1$, $202_2$, $202_3$, and $202_4$ according to one embodiment of the present invention. Each antifuse bank includes a number of antifuses. For example, the antifuse bank $202_1$ includes antifuses $220_1$–$220_n$; the antifuse bank $202_2$ includes antifuses $222_1$–$222_n$; the antifuse bank $202_3$ includes antifuses $224_1$–$224_n$; and the antifuse bank $202_4$ includes antifuses $226_1$–$226_n$. Each antifuse 220–226 is selected by one of a number of address signals $ADDRESS_1$–$ADDRESS_n$ that select antifuses 220–226 in a given row of each bank $202_1$–$202_4$, and by one of a number of signals, $DQ_1$–$DQ_4$ that select antifuses in a given column corresponding to the banks $202_1$–$202_4$. Each ADDRESS signal can be likened to a row address, and each DQ signal can be likened to a column address. One ADDRESS signal may address multiple antifuses across several antifuse banks. One DQ signal may address multiple antifuses within the same antifuse bank.

To prevent the problem of sinking a large current as explained hereinabove, various embodiments of the present invention provide for a current limiter to limit this large current. The antifuse bank $202_1$ includes a current limiter $210_1$. One current limiter per antifuse bank may be sufficient to limit the large current within the same antifuse bank. This economizes the cost of manufacturing the current limiter. Other antifuse banks also include a current limiter, such as a current limiter $210_2$ for the antifuse bank $202_2$, a current limiter $210_3$ for the antifuse bank $202_3$, and a current limiter $210_4$ for the antifuse bank $202_4$.

Figure 4:
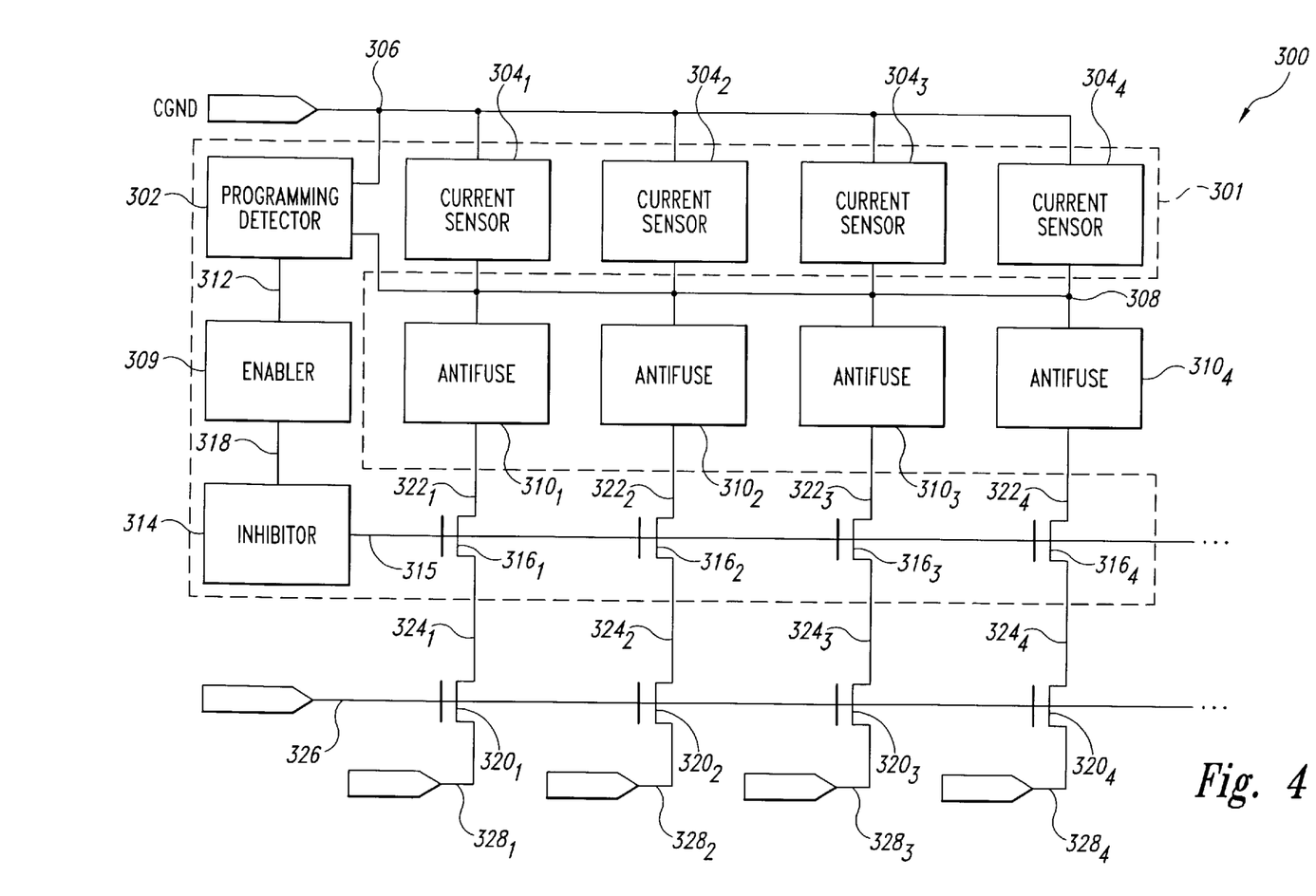
FIG. 4 is a block diagram of an antifuse bank that includes a current limiter according to one embodiment of the present invention.

FIG. 4 is a block diagram of an antifuse bank 300 that includes a current limiter 301 according to one embodiment of the invention. The antifuse bank 300 includes a number of antifuses, such as antifuses $310_1$–$310_4$. A first terminal of each antifuse is coupled to a node 308, and a second terminal of each antifuse is coupled to the current limiter 301. A number of selectors, such as n-channel transistors $320_1$–$320_4$, allow a particular antifuse $310_1$–$310_4$ to be selected for programming. The gate of each of the n-channel transistors $320_1$–$320_4$ is coupled to a node 326, the source of each transistor is coupled to one of a number of nodes $328_1$–$328_4$, and the drain of each transistor is coupled to the current limiter 301. To select an antifuse for programming, a DQ* (or FA) signal at a high level is provided at the node 326, and contemporaneously, an ADDRESS signal at ground is provided at one of the nodes $328_1$–$328_4$. For example, if the antifuse $310_1$ is to be programmed, a high level DQ* signal should be provided at the node 326 to turn ON the n-channel transistor $320_1$, and the ADDRESS signal, which should be at ground, is provided at the node $328_1$.

The current limiter 301 includes a number of current sensors $304_1$–$304_4$ that sense whether current is flowing toward the antifuse 310 and generate a sensed voltage responsive thereto. Each current sensor has a first terminal coupled to a node 306 and a second terminal coupled to one of the antifuses $310_1$–$310_4$ through a node 308. A high voltage signal CGND for programming the antifuses $310_1$–$310_4$ is provided through the node 306. Also coupled to the node 306 is a first input terminal of a programming detector 302; its second input terminal is coupled to the node 308. An output terminal of the programming detector 302 is coupled to an enabler 309 through the node 312, and the enabler 309 is coupled to an inhibitor 314 through the node 318. A number of switches $316_1$–$316_4$ couple the selectors $320_1$–$320_4$ to the antifuses $310_1$–$310_4$. Each switch $316_1$–$316_4$ has a gate, which is coupled to the inhibitor 314 via a node 315, a drain, which is coupled to one of the antifuses $310_1$–$310_4$ through one of the nodes $322_1$–$322_4$, and a source, which is coupled to one of the selectors $320_1$–$320_4$.

The operation of the current limiter 301 to limit current is similar for any one of the antifuses $310_1$–$310_4$, and thus, for the sake of brevity, the following discussion focuses on limiting current during the programming of one of the antifuses $310_1$–$310_4$. For example, if the antifuse $310_1$ is to be programmed then an initial step is to turn ON the selector $320_1$. The DQ* signal at a high level is provided at the node 326 and the ADDRESS signal at ground is provided at the node $328_1$ to turn ON the selector $320_1$. The inhibitor 314 also provides a high voltage signal at the node 315 so that the switch $316_1$ is turned ON to couple the antifuse $310_1$ to the selector $320_1$. Next, the high voltage signal CGND is provided at the node 306.

Over a brief period, as the high resistance dielectric of the antifuse $310_1$ is broken down by the high voltage signal CGND, more and more current flows from a source of the high voltage signal CGND to the node 306, through the current sensor $304_1$ and the antifuse $310_1$, and through the switch $316_1$ and the selector $320_1$ to reach ground at the node $328_1$. The current sensor $304_1$ senses this current and generates a sensed voltage, which is provided to the programming detector 302. When a sufficiently large sensed voltage (generated from a sufficiently large current) is impressed upon the programming detector 302, the enabler 309 is activated to enable the inhibitor 314 to provide a low voltage signal at the node 315 and thereby turn OFF the switch $316_1$. An open circuit therefore exists with the switch $316_1$ being turned OFF so that the potentially large current can no longer be shorted to ground. Antifuses in any or all of the other antifuse banks $202_1$–$202_4$ can be programmed at the same time. An address $ADDRESS_{1-N}$ (FIG. 3) is applied to access respective banks. If all banks $202_1$–$202_4$ are enabled (DQ1–DQ4), all four of those fuses are blown. This is possible because the current path is shut off in each bank $201_1$–$202_4$ as soon as the fuse in that bank is blown. A programming voltage of a sufficient magnitude can therefore be applied to other antifuses $310_2$–$310_4$ after the inhibitor is reset.

Figure 5:
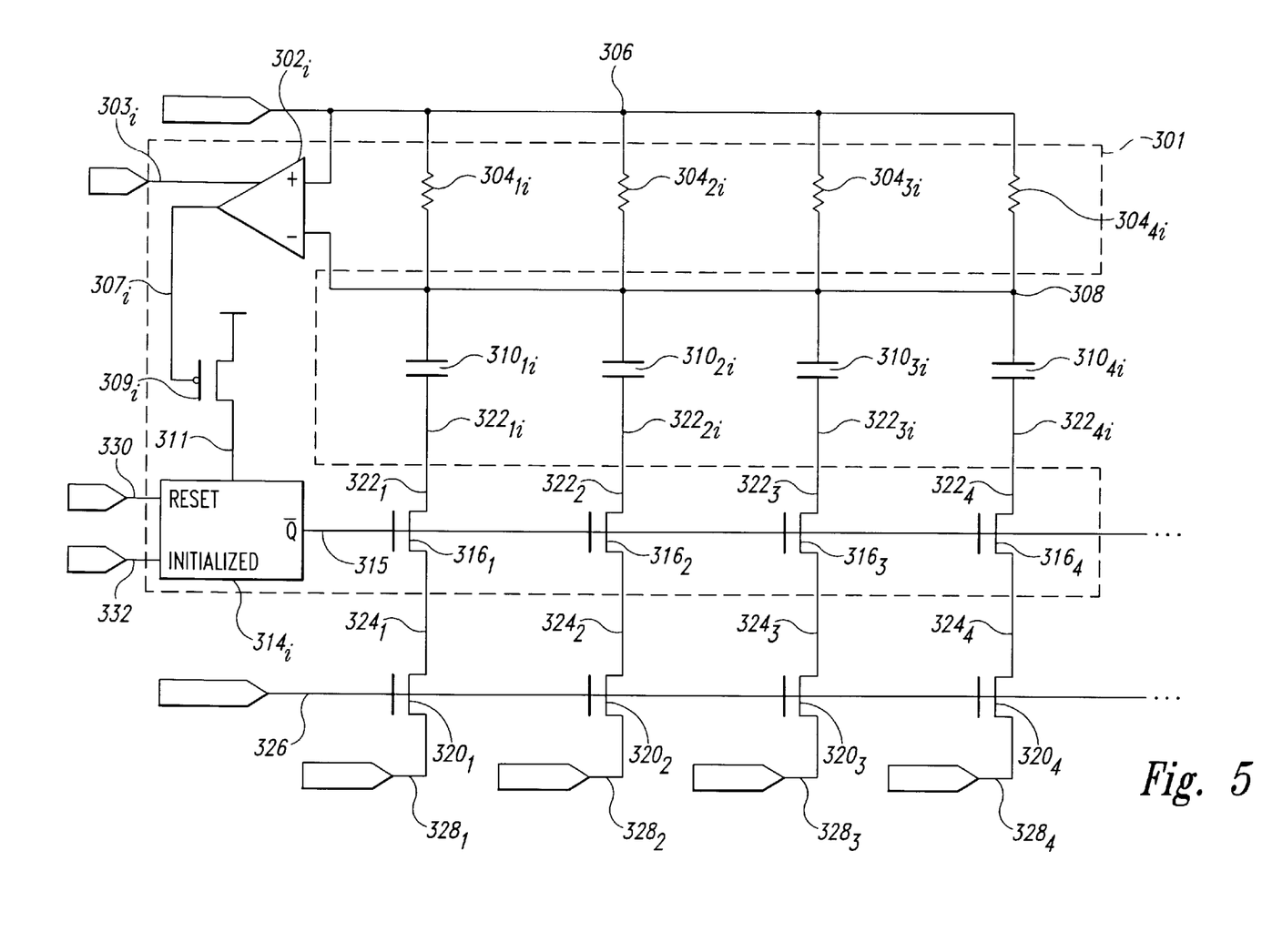
FIG. 5 is a circuit diagram of the antifuse bank that includes the current limiter according to one embodiment of the present invention.

FIG. 5 is a circuit diagram of the antifuse bank 300 that includes one embodiment of the current limiter 301 of FIG. 4. Each of the antifuses $310_1$–$310_4$ is implemented as capacitors $310_{1i}$–$310_{4i}$. The current sensors $304_1$–$304_4$ are implemented as resistors $304_{1i}$–$304_{4i}$. The programming detector 302 is implemented as a comparator $302_i$ having an enabling port coupled to a node $303_i$, a positive terminal coupled to the node 306, a negative terminal coupled to the node 308, and an output terminal coupled to the node $307_i$. Also coupled to the node $307_i$ is the gate of a p-channel transistor $309_i$, which is an implementation of the enabler 309 of FIG. 4. The source of the p-channel transistor 309$i$ is coupled to a high voltage source, such as a positive pumped voltage source, and the drain is coupled to an input terminal of a latch $314_i$ through the node 311. The inhibitor 314 is implemented by this latch $314_i$ having two input ports and a complemented output terminal (Q*) coupled to the node 315. The two input ports, reset and initialized, which are coupled to nodes 330 and 332, respectively, allow external control of the latch $314_i$. The remaining circuit components, such as the switches $316_1$–$316_4$ and the selectors $320_1$–$320_4$, are coupled to the rest of the circuit of FIG. 5 as discussed in FIG. 4, and for the sake of brevity, will not be discussed further.

As discussed above in FIG. 4, the operation of the circuit of FIG. 5 to program, for example, the antifuse $310_{1i}$, begins by turning ON both the selector $320_1$ and the switch $316_1$ to define a conducting path for current from the node $322_1$ to ground at the node $328_1$. A high voltage CGND is provided at the node 306 to break down the dielectric of the antifuse $310_{1i}$ so that the conducting path may be extended from the node 306 to the node $328_1$. Through this conducting path, more and more programming current may flow from which a voltage generated by the resistor $304_{1i}$ is provided to the negative port of the comparator $302_i$. When a sufficient voltage level is reached (and hence, a large enough current flowing through the resistor $304_{1i}$), the comparator $302_i$ will provide a low voltage level signal at the node 307 to turn ON (forward-bias) the p-channel transistor $309_i$. The high voltage source that is coupled to the source of the p-channel transistor $309_i$ will then be connected to the latch $314_i$ by the forward-biased p-channel transistor $309_i$ through the node 311. Upon receiving the high voltage source, the latch 314$i$ is set and provides a low voltage level signal at the node 315, which turns OFF the switch $316_1$. The conducting path is then open to prevent the large current from shorting to ground at the node $328_1$.

The discussion hereinbefore has been focused on enhancing the programming or writing of the antifuses $310_{1i}$–$310_{4i}$ by using the current limiter 301. To prepare the antifuses $310_{1i}$–$310_{4i}$ for reading, various components of the current limiter may be adjusted after the programming process. For example, the comparator $302_i$ is recommended to be enabled only during programming by providing a high level PROGRAM MODE signal at the node $303_i$ coupled to the enabling port so that the comparator $302_i$ will not inadvertently set the latch circuit $314_i$ during a read. As another example, the latch circuit $314_i$ is recommended to be initialized to provide a high voltage signal by applying a POWERUP signal to the initialized input port upon powering up so that the switches $316_1$–$316_4$ are ON to allow a read. As a further example, after the antifuse $310_{1i}$ has been programmed, the latch circuit $314_i$ may be reset to output a high voltage by providing a high level DQ signal to the reset input port so that the latch circuit $314_i$ does not inadvertently turn OFF the switches $316_1$–$316_4$. This reset allows the programmed state of the antifuse $310_{1i}$ to be read.

Figure 6:
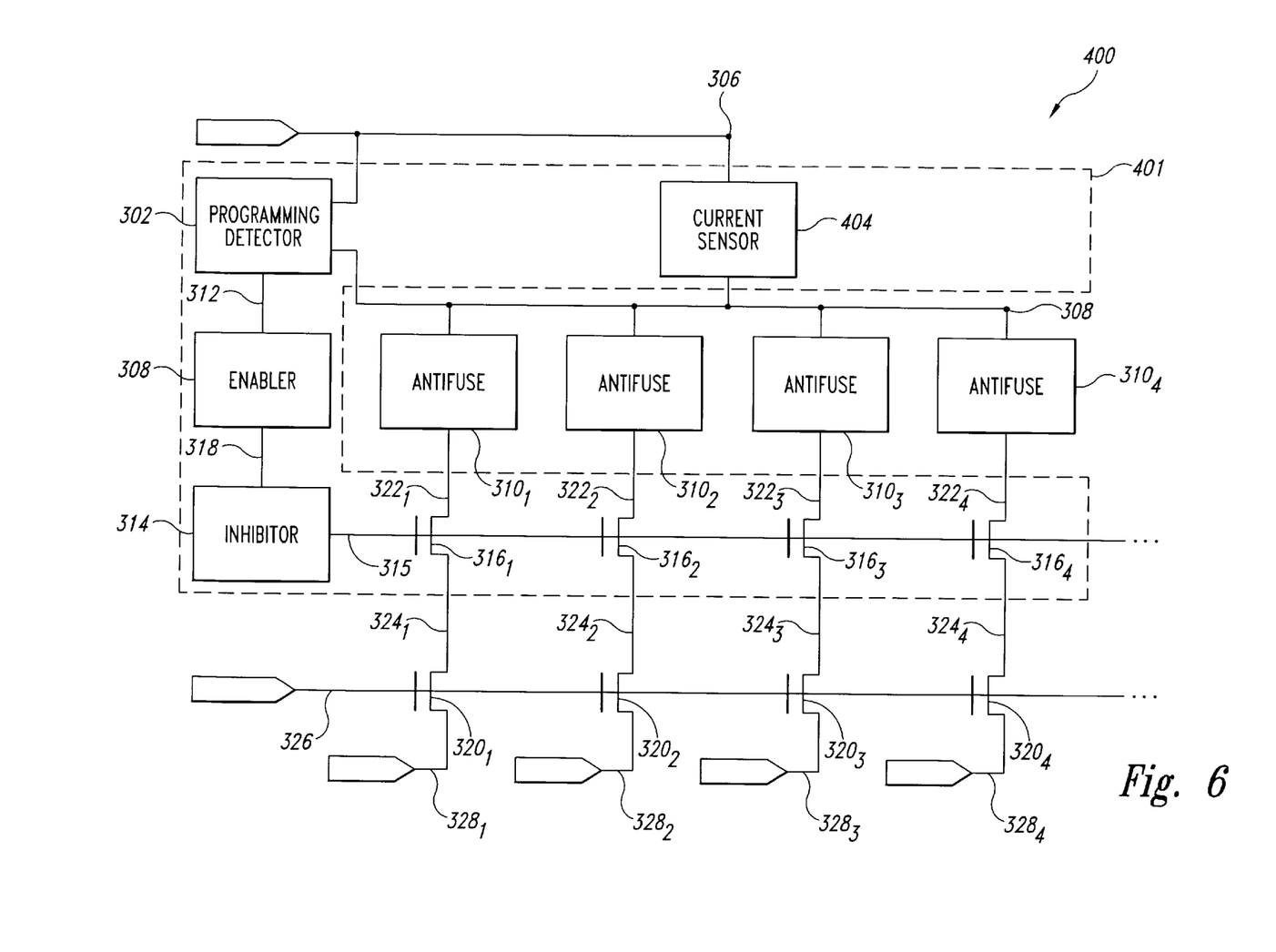
FIG. 6 is a block diagram of an antifuse bank that includes a current limiter according to one embodiment of the present invention.

FIG. 6 is a block diagram of an antifuse bank 400 that includes a current limiter 401 according to another embodiment of the present invention. The current limiter 401 is similar to the current limiter 301 as discussed with respect to FIG. 4. The difference, however, is that only one current sensor 404 is used instead of a current sensor for each antifuse $310_1$–$310_4$ as discussed with respect to the current limiter 301 in FIG. 4. One implementation of the current sensor 404 includes placing only one resistor between the node 306 and the node 308. When any of the antifuses $310_1$–$310_4$ is programmed, a voltage appears across this one resistor, which is detected by the programming detector 302. The remaining operation of the current limiter 401 is similar to the current limiter 301, which is discussed above.

Figure 7:
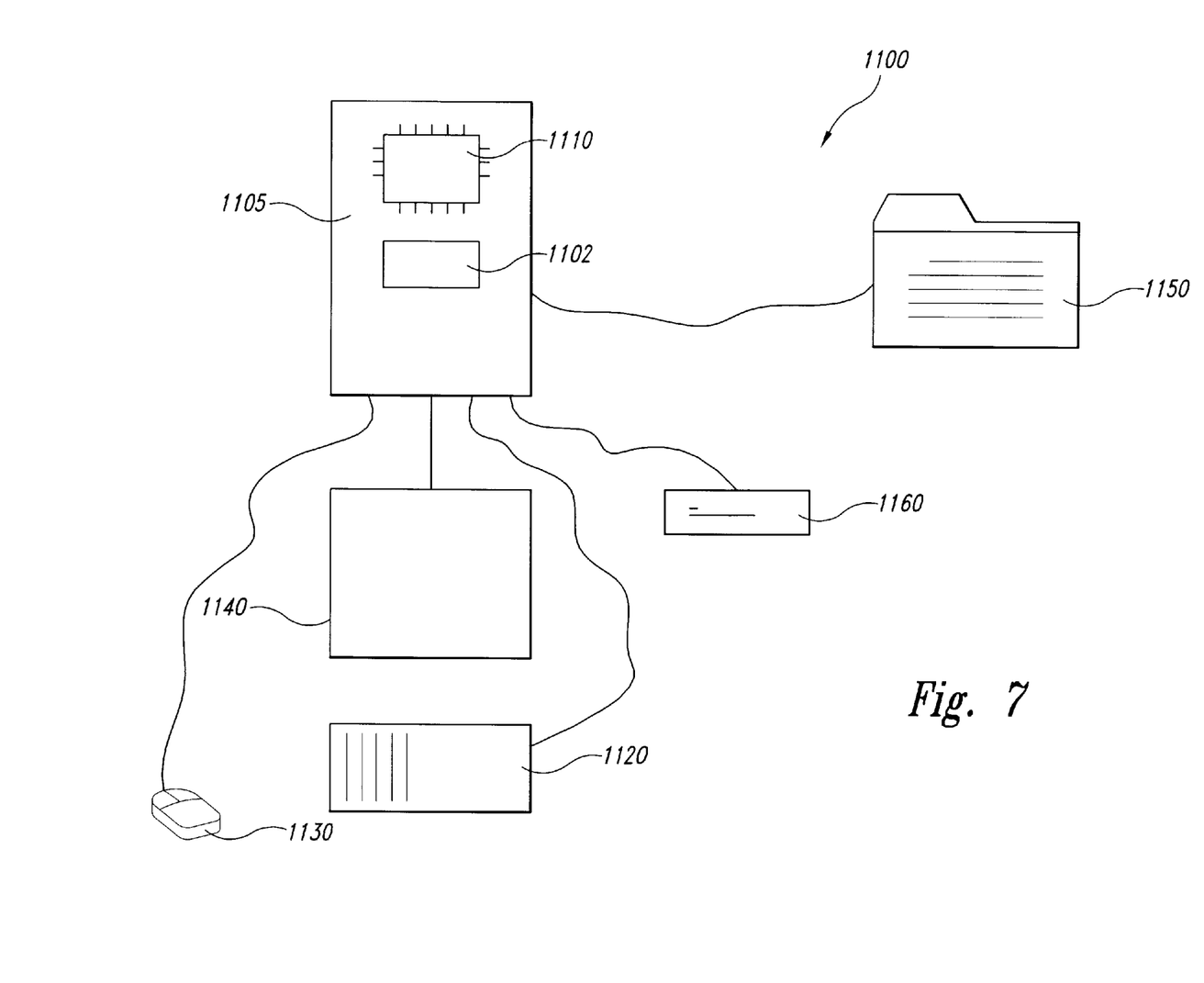
FIG. 7 is a block diagram of a computer system according to one embodiment of the present invention.

FIG. 7 is a block diagram of a computer system according to one embodiment of the present invention. The computer system 1100 contains a processor 1110 and a memory system 1102 housed in a computer unit 1105. The computer system 1100 is but one example of an electronic system containing another electronic system, e.g., memory system 1102, as a subcomponent. The memory system 1102 may include one of the embodiments of the antifuse circuitry of the present invention. The computer system 1100 optionally contains user interface components, such as a keyboard 1120, a pointing device 1130, a monitor 1140, a printer 1150, and a bulk storage device 1160. It will be appreciated that other components are often associated with computer system 1100 such as modems, device driver cards, additional storage devices, etc. It will further be appreciated that the processor 1110 and memory system 1102 of computer system 1100 can be incorporated on a single integrated circuit. Such single-package processing units reduce the communication time between the processor and the memory circuit.

Although the specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. It is to be understood that the above description is intended to be illustrative, and not restrictive. Combinations of the above embodiments and other embodiments will be apparent to those of skill in the art upon reviewing the above description. The scope of the invention includes any other applications in which the above structures and fabrication methods are used. Accordingly, the scope of the invention should only be determined with reference to the appended claims, along with the full scope of equivalents to which such claims are entitled.

I claim:

1. An antifuse bank, comprising:
   a signal source for providing a high voltage level for programming the antifuse bank;
   at least one antifuse having a dielectric interposed between two electrodes;
   at least one selector to select the at least one antifuse corresponding to an address;
   a current sensor having a sense terminal coupled to one electrode of the at least one antifuse and further having an enable terminal, the current sensor providing an active enable signal in response to sensing a current at the sense terminal exceeding a current threshold; and
   a current limiter having a first connection coupled to the signal source, a second connection coupled to the enable terminal, and a third connection coupled to the at least one selector, the current limiter allowing current to be inhibited from flowing through the at least one antifuse in response to an active enable signal.

2. The antifuse bank of claim 1, wherein the signal source has two states, one of the two states includes a low voltage level, and the other of the two states includes the high voltage level that is asserted for programming the antifuse bank.

3. The antifuse bank of claim 1, wherein the two electrodes are electrically coupled when the at least one antifuse is programmed by the high voltage level of the voltage source.

4. The antifuse bank of claim 1, wherein each selector has a first input electrode to receive a column address and a second input electrode to receive a row address.

5. The antifuse bank of claim 4, wherein when the column address is high and when the row address is low, a complete circuit path is formed from the voltage source to ground so that the at least one antifuse is programmed.

6. A computer system, comprising:
   a processor;
   a memory system that comprises a plurality of memory modules, one of the plurality of the memory modules comprises a plurality of memory devices;
   a plurality of command links coupled to the plurality of memory devices to communicate at least one command signal;
   a plurality of data links coupled to the plurality of memory devices to communicate data;
   a memory controller;
   at least one user interface device, wherein the at least one user interface device includes a monitor;
   at least one output device, wherein the at least one output device includes a printer;
   at least one bulk storage device, wherein at least one memory device of the plurality of memory devices includes an antifuse bank comprising:
      a signal source having a high voltage level for programming the antifuse bank;
      at least one antifuse having a dielectric interposed between two electrodes;
      at least one selector to select the at least one antifuse corresponding to an address;
      a current sensor having a sense terminal coupled to one electrode of the at least one antifuse and further having an enable terminal, the current sensor providing an active enable signal in response to sensing a current at the sense terminal exceeding a current threshold; and
      a current limiter having a first terminal coupled to the signal source, a second terminal coupled to the enable terminal, and a third terminal coupled to the at least one selector, in response to an active enable signal, the current limiter inhibiting current from flowing through the at least one antifuse until the at least one access circuit receives another address, without having to delay by a delay circuit for a programmed time period.

7. A method for programming an antifuse bank, comprising:
   accessing the antifuse bank by providing a row address and a column address;
   raising a signal source to a high voltage level for programming the antifuse bank;
   programming an antifuse by coupling the antifuse to the signal source; and
   inhibiting current from flowing through the antifuse without delaying by a programmed time period and sensing current flowing through the antifuse before the act of inhibiting is executed.

8. The method of claim 7, wherein accessing the antifuse bank includes providing a column address, wherein the column address addresses the antifuse as well as other antifuses within the antifuse bank.

9. The method of claim 7, wherein programming the antifuse includes breaking a dielectric between two terminals of the antifuse so that the two terminals are electrically shorted to conduct current from the voltage source.

10. The method of claim 7, wherein accessing the antifuse bank includes providing a row address, wherein the row address addresses the antifuse bank as well as other antifuse banks.

11. An antifuse bank, comprising:
    a signal source having a high voltage level for programming the antifuse bank;
    at least one antifuse having a dielectric interposed between two electrodes;
    at least one current sensor having one terminal coupled to the signal source and another terminal coupled to the at least one antifuse;
    at least one selector to select the at least one antifuse corresponding to an address;
    at least one switch having a first electrode coupled to the at least one antifuse, a second electrode coupled to the at least one selector, and a third electrode; and
    an inhibitor coupled to the third electrode of the at least one switch, the inhibitor inhibiting current from flowing through the at least one antifuse by opening the at least one switch without having to delay by a programmed time period.

12. The antifuse bank of claim 11, wherein the at least one current sensor includes only one current sensor.

13. The antifuse bank of claim 11, wherein the at least one current sensor includes at least two current sensors.

14. The antifuse bank of claim 11, wherein the at least one switch includes an n-channel transistor having a gate, source, and drain, the gate coupled to the inhibitor, the drain coupled to the antifuse, and the source coupled to the at least one selector.

15. The antifuse bank of claim 11, wherein the at least one selector includes an n-channel transistor having a gate, source, and drain, the gate coupled to the column address, the drain coupled to the second electrode of the at least one switch, and the source coupled to the row address.

16. A method for programming an antifuse bank, comprising:

accessing an antifuse by providing an address;

raising a signal source to a high voltage level for programming the antifuse;

sensing current flowing through the antifuse; and inhibiting current from flowing through the antifuse without delaying by a delaying circuitry when the current is sensed by the act of sensing, wherein the act of inhibiting continues to inhibit current from flowing until reading of the programmed state of the antifuse is desired, or accessing another fuse in the bank is desired.

17. The method of claim 16, wherein sensing includes sensing by only one current sensor.

18. The method of claim 16, wherein sensing includes sensing by at least two current sensors.

19. The method of claim 16, wherein inhibiting includes switching a switch to open a conductive path so that current is inhibited from flowing through the antifuse.

20. The method of claim 16, wherein inhibiting includes switching a switch to close a conductive path for programming or reading the antifuse.

21. A method for limiting current through an antifuse, comprising:

closing a switch that couples the antifuse to a selector;

selecting the antifuse for programming by providing an address to the selector;

detecting a voltage from sensing current flowing through the antifuse;

generating an enabled signal when the act of detecting detects the voltage; and inhibiting current from flowing through the antifuse when the enabled signal is generated by opening the switch until the address is changed or reading the fuse is desired.

22. The method of claim 21, wherein selecting includes providing an address to the access circuit to close an access switch so as to create a conductive path for current to flow to program the antifuse.

23. The method of claim 21, further comprising closing the switch while opening another switch after the antifuse is programmed.

24. The method of claim 21, wherein the act of detecting a voltage is executed only during the programming of an antifuse.

25. The method of claim 21, wherein the method does not proceed in the order presented.

26. A circuit for enhancing programming of an antifuse bank which includes multiple antifuses, each antifuse having a dielectric between two electrodes, the circuit comprising:

a signal source for programming an antifuse;

at least one resistor having a lead coupled to the voltage source, and another lead coupled to one of the two electrodes of the antifuse to define a node;

at least one switching transistor having a gate, a source, and a drain coupled to the other of the two electrodes of the antifuse; and a latch having a complementary output coupled to the gate of the at least one switching transistor and providing a control signal out of the complementary output to control the at least one switching transistor, the latch transitioning the control signal to reverse-bias the at least one switching transistor when sufficient current flows across the at least one resistor, the latch transitioning the control signal to forward-bias the at least one switching transistor when inhibiting current is no longer desired.

27. The circuit of claim 26, further comprising a comparator having an output, a positive input coupled to the voltage source, and a negative input coupled to the node.

28. The circuit of claim 27, further comprising a p-channel transistor having a gate coupled to the output of the comparator, a source coupled to a supply voltage, and a drain coupled to the latch.

29. The circuit of claim 28, wherein the latch includes a reset input port for receiving a DQ signal.

30. The circuit of claim 29, further comprising an access transistor having a drain coupled to the source of the switching transistor, a gate coupled to a complementary of the DQ signal, and a source coupled to a column address.

31. A method for enhancing programming of an antifuse bank which includes a set of antifuses, each antifuse having a dielectric between two electrodes, the method comprising:

providing a signal source for programming an antifuse;

sensing current by at least one resistor having a lead coupled to the voltage source, and another lead coupled to one of the two electrodes of the antifuse to define a node;

switching by at least one switching transistor having a gate, a source, and a drain, wherein the drain of the at least one switching transistor is coupled to the other of the two electrodes of the antifuse; and latching by a latch having a complementary output coupled to the gate of the at least one switching transistor and providing a control signal out of the complementary output to control the at least one switching transistor, the latch transitioning the control signal to reverse-bias the at least one switching transistor when current flows across the at least one resistor, the latch transitioning the control signal to forward-bias the at least one switching transistor when inhibiting current is no longer desired.

32. The method of claim 31, further comprising comparing by a comparator having an output, a positive input coupled to the voltage source, and a negative input coupled to the node.

33. The method of claim 32, further comprising enabling the latch by a p-channel transistor having a gate coupled to the output of the comparator, a source coupled to a supply voltage, and a drain coupled to the latch.

34. The method of claim 33, further comprising resetting the latch by inputting a DQ signal into a reset input port of the latch.

35. The method of claim 34, further comprising an access transistor having a drain coupled to the source of the switching transistor, a gate coupled to a complementary of the DQ signal, and source coupled to a column address.

36. A number of antifuse banks, each antifuse bank comprising:

a signal source for programming the number of antifuse banks;

a plurality of antifuses in each antifuse bank, the plurality of antifuses coupled to the signal source, the plurality of antifuses adapted to be accessed by a plurality of row addresses and one column address;

a current sensor coupled to each antifuse bank for generating an enable signal in response to sensing a current exceeding a current threshold; and a current limiter coupled to the plurality of antifuses for inhibiting current from flowing through the plurality of antifuses in response to the enable signal without having to delay by a programmed time period.

37. The number of antifuse banks of claim 36, wherein a fuse in each bank can be programmed simultaneously.

38. The number of antifuse banks of claim 36, wherein the current limiter includes an inhibitor circuit that decouples the plurality of antifuses from ground so as to inhibit current from flowing.

39. The number of antifuse banks of claim 38, wherein the current limiter includes a latch that is set when current flows across one of the at least four antifuses.

40. The number of antifuse banks of claim 39, wherein the latch is reset when the one column address is changed.

* * * * *